United States Patent
Braswell et al.

(10) Patent No.: US 10,298,257 B1
(45) Date of Patent: May 21, 2019

(54) SNDR IMPROVEMENT THROUGH OPTIMAL DAC ELEMENT SELECTION

(71) Applicant: NXP USA, Inc.

(72) Inventors: Brandt Braswell, Chandler, AZ (US); Douglas Alan Garrity, Gilbert, AZ (US); Paul Rene DeRouen, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/222,803

(22) Filed: Dec. 17, 2018

(51) Int. Cl.
*H03M 3/00* (2006.01)
*H03M 1/06* (2006.01)
*H03M 1/12* (2006.01)
*H03M 1/10* (2006.01)
*H03M 1/00* (2006.01)

(52) U.S. Cl.
CPC .......... *H03M 3/464* (2013.01); *H03M 3/368* (2013.01); *H03M 1/001* (2013.01); *H03M 1/06* (2013.01); *H03M 1/1009* (2013.01); *H03M 1/12* (2013.01); *H03M 3/30* (2013.01); *H03M 3/424* (2013.01)

(58) Field of Classification Search
CPC ...... H03M 1/001; H03M 1/1009; H03M 1/06; H03M 3/30; H03M 1/12
USPC .......................... 341/143, 110, 120, 118, 155
See application file for complete search history.

(56) References Cited

U.S. PATENT DOCUMENTS

| 7,868,806 | B2 | 1/2011 | Seo et al. | |
|---|---|---|---|---|
| 9,407,279 | B2 | 8/2016 | Melanson et al. | |
| 2012/0194366 | A1* | 8/2012 | Zare-Hoseini | H03M 1/0665 341/110 |

OTHER PUBLICATIONS

Tang et al., "A 14 bit 200 MS/s DAC With SFDR > 78 dBc, IM3 < -83 dBc and NSD < -163 dBm/Hz Across the Whole Band Nyquist Band Enabled by Dynamic-Mismatch Mapping," IEEE Journal of Solid-State Circuits, vol. 46, No. 6, Jun. 2011, pp. 1371-1381; 11 pages.

* cited by examiner

*Primary Examiner* — Joseph J Lauture

(57) ABSTRACT

A method for Signal-to-Noise and Distortion Ratio (SNDR) improvement through optimal Digital-to-Analog-Converter (DAC) element selection includes randomizing an order of a plurality of unit elements of a DAC, wherein each of the unit elements is controlled by a respective one of a plurality of digital inputs of the DAC. The plurality of digital inputs is sequentially asserted over at least a subset of a full set of the digital inputs to generate a plurality of analog values of an output of the DAC. A first SNDR of the DAC is measured from the plurality of analog values. A maximum SNDR, corresponding to an optimal order, is determined from the first SNDR and at least one previously measured SNDR. The optimal order of the unit elements of the DAC is stored in a memory to define connections between the digital inputs and the respective unit elements based on the optimal order.

20 Claims, 6 Drawing Sheets

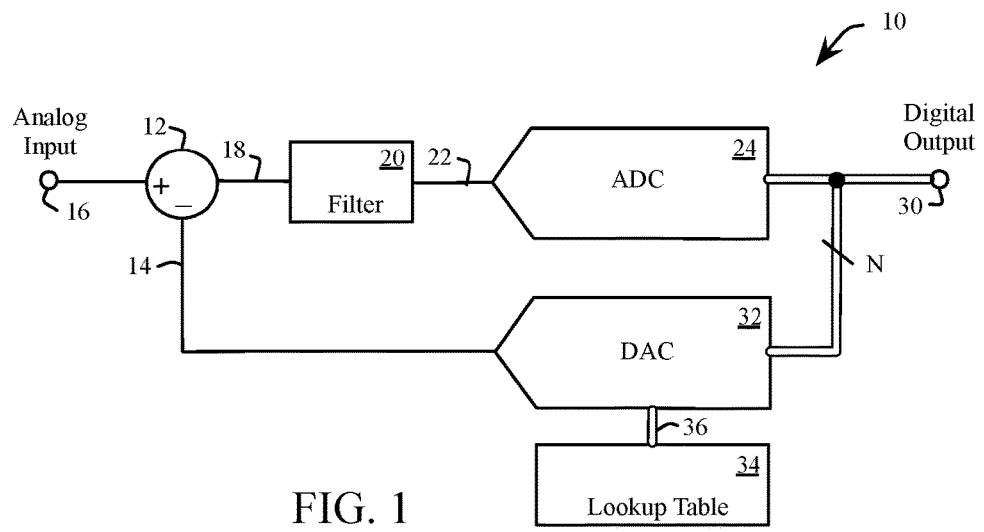
FIG. 1
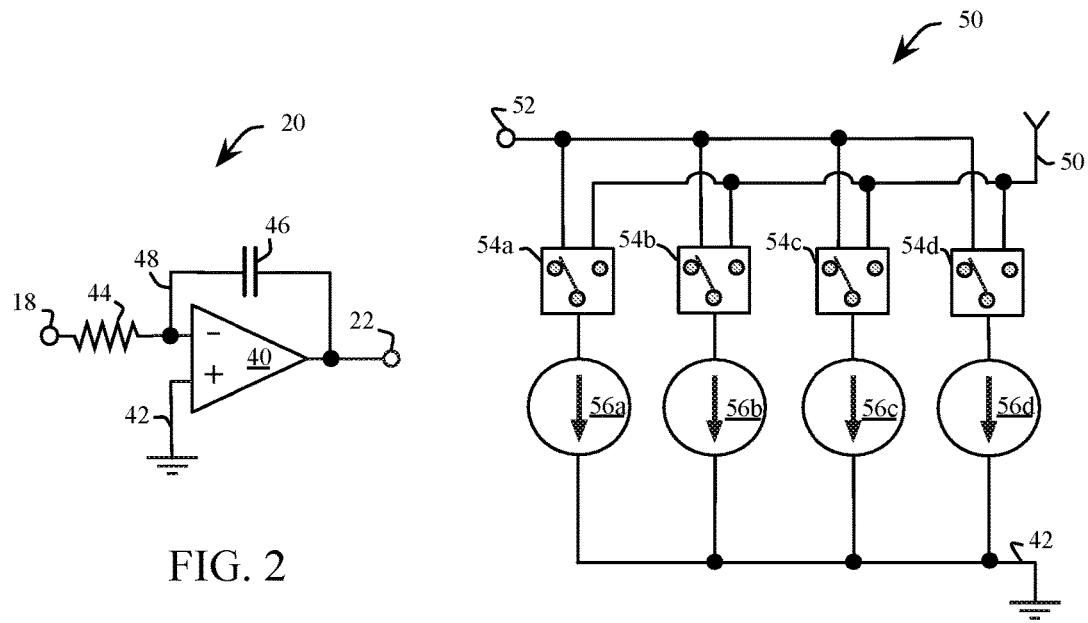
FIG. 2
FIG. 3

SNDR IMPROVEMENT THROUGH OPTIMAL DAC ELEMENT SELECTION

FIELD

This disclosure relates generally to data conversion, and more specifically to improving the linearity of a Sigma-Delta Analog-to-Digital Converter (ADC).

BACKGROUND

A Sigma-Delta ADC encodes an analog signal into a digital output signal. The first step in converting the analog signal with the Sigma-Delta ADC is to form a "delta" or difference between the analog input and the digital output converted back to analog form by a Digital-to-Analog Converter (DAC). This feedback of the digital output through the DAC introduces a significant source of nonlinearity in the converter system, which limits the overall system performance.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is a schematic view of a system for Signal-to-Noise plus Distortion Ratio (SNDR) improvement through optimal DAC element selection in accordance with an example embodiment of the present disclosure.

FIG. 2 is a schematic view of an embodiment of the filter of FIG. 1.

FIG. 3 is a schematic view of an embodiment of the current-output unit element DAC of FIG. 1.

DETAILED DESCRIPTION

Figure 4:
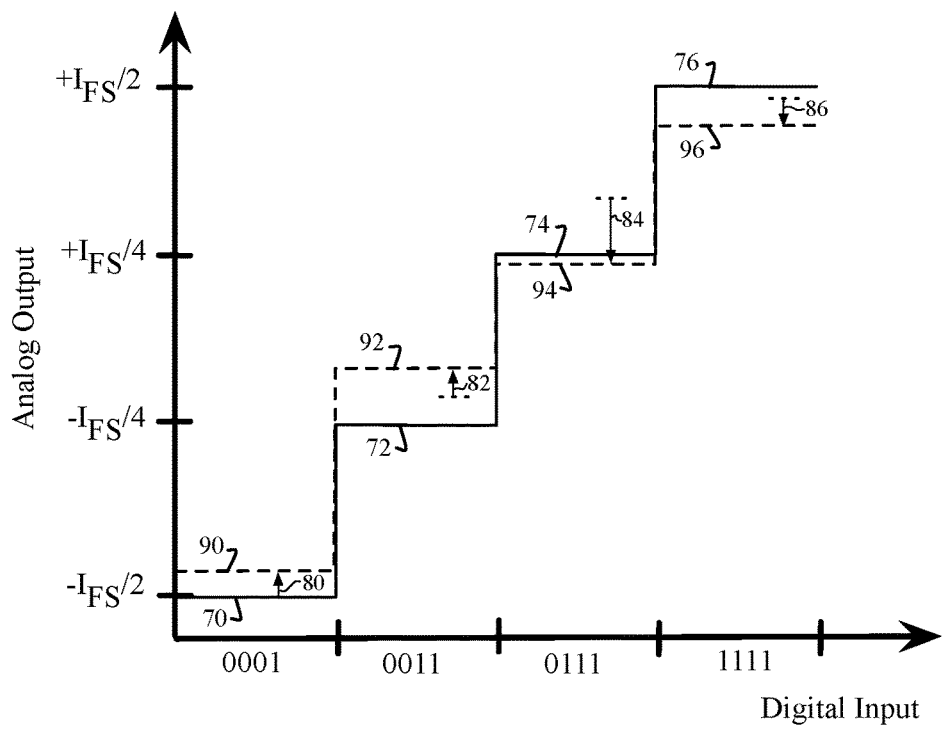
FIG. 4 is a graphical view of the output of the DAC of FIG. 1 without optimal DAC element selection.

Embodiments described herein provide for SNDR improvement by optimizing the linearity of a DAC in a Sigma-Delta ADC. Specifically, the linearity of the DAC is improved by optimally selecting the order in which DAC unary current sources (e.g., elements) are selected to convert the time variant digital output of the ADC. The DAC output (e.g., an analog output) is comprised of the sum of the individual unit element currents, which each have a random offset current in which the cumulative offset current, and therefore the linearity, are minimized through optimal element ordering.

The distortion due to nonlinearity in a Sigma-Delta ADC, (either continuous or discrete), is dominated by how well the feedback DAC elements match each other. Solutions to this include using a single bit feedback DAC, which implies linearity because only two element states are possible. One problem with using a single bit feedback DAC is that to obtain the same dynamic range as a multi-bit DAC, a higher oversampling ratio is required. Consequently, a higher clock rate is required, which increases power consumption.

Another approach to reducing the nonlinearity of a Sigma-Delta ADC is to compensate for the element mismatch in the DAC with a mismatch shaping algorithm. This approach shapes the error from the DAC nonlinearity, due to the element mismatch, out of the signal band. However, this approach increases the in-band noise floor, and also adds delay to the ADC feedback loop, thus degrading loop stability. In discrete time Sigma-Delta conversion this is not as problematic, but in continuous time Sigma-Delta conversion special attention must be paid to the glitch energy that occurs with implementing shaped randomization of the DAC element choices. Shaping increases glitch energy due to the switching of the DAC elements. This glitch energy occurs at the summing junction of the integrator as the analog input and the DAC feedback are integrated. Consequently, the integration of this glitch energy can significantly degrade the conversion performance.

Another option to reduce the DAC nonlinearity is to increase the size of the DAC elements to improve the matching between the elements. This approach increases area and power consumption, which is particularly undesirable for converters in an embedded design (e.g., on a monolithic integrated circuit).

Embodiments described herein overcome the limitations of the aforementioned approaches requiring higher oversampling ratios for a given SNR, shaping or increasing the layout area. By executing a series of analog to digital conversions with a Sigma-Delta ADC and observing the SNDR with a Fourier transform (e.g., a Fast Fourier Transform), an optimized ordering of the elements is determined to maximize the SNDR. Each conversion permutes the order of the DAC elements resulting in a different SNDR. The optimized ordering yielding the largest SNDR, is then stored in a lookup table accessible by the DAC during data conversion operations with the Sigma-Delta ADC.

While various embodiments of this disclosure are directed towards improving SNDR of a Sigma-Delta ADC by optimizing element ordering of a feedback DAC within the converter, similar SNDR advantages are realized by applying the teaching of this disclosure to a standalone unit element DAC. Similarly in other embodiments, SNDR improvement of a unit element DAC is advantageous in systems comprising the unit element DAC.

FIG. 1 shows an embodiment 10 of a system for SNDR improvement though optimal DAC element selection in accordance with an example embodiment of the present disclosure. A summing circuit 12 subtracts a DAC output 14 from an analog input 16 to determine a delta value 18. The delta value 18 is filtered by a filter 20 to determine a filtered value 22. In one embodiment, the filter 20 is a low pass filter. In another embodiment, the filter 20 is a band pass filter. A multi-bit ADC converts the filtered value 22 into a multi-bit digital output 30 of width "N." In one embodiment, the ADC 24 is a flash ADC and the digital output 30 is coded as a thermometer code. For example, a 4-bit ADC 24 has a digital output of 16 bits, which are input to the DAC 32. In another embodiment, the digital output 30 is converted to a 4-bit binary code and fed into a decimation filter (not shown), thus converting the system 10, (based on a Sigma-Delta modulator) into a Sigma-Delta ADC.

Other bit widths are envisioned within by this disclosure. Increasing the bit width of the ADC 24 beneficially reduces quantization noise. The multi-bit digital output 30 is converted into a DAC output 14 output by a unit element DAC 32. The DAC 32 accesses a lookup table 34 over a connection 36, to define connections between the digital inputs of the DAC 32 and the respective unit elements included therein.

The lookup table 34 holds the values that determine an optimized ordering of the DAC elements, as further discussed with reference to FIG. 3. The lookup table 34 is outside of the control loop formed by the summing circuit 12, the low pass filter 20, the multi-bit ADC and the multi-bit unit element DAC 32. Accordingly, the lookup table 34 does not add control loop delay, nor affect loop stability. In various embodiments, the lookup table 34 is formed with a Non-Volatile Memory, include one or more of a laser fuse, and EPROM, a One Time Programmable memory, and the like. The teachings of this disclosure are also applicable to higher order Sigma-Delta ADCs having a plurality of feedback paths from one or more DACs to one or more summing circuits between the analog input 16 and the multi-bit digital output 30. For embodiments including higher order Sigma-Delta ADCs, each of the DACs may have an optimized ordering of their respective unary current sources. However, most of the reduction in distortion is obtained by optimizing the DAC whose output feeds the first summing circuit connected directly to the analog input 16.

FIG. 2 is an embodiment 20 of the filter 20 of FIG. 1, configured as an integrator. An amplifier 40 includes a positive input connected to a ground 42. The delta value 18 of FIG. 1 is connected to a negative input 48 through a resistor 44. The amplifier 40 generates the filtered value 22 of FIG. 1, which is further connected to the negative input 48 through a feedback capacitor 46. Glitch energy caused by switching of the elements of the multi-bit unit element DAC 32 is fed directly into the summing circuit 12 of FIG. 1 and integrated at the negative input 48, thus undesirably contributing to system noise.

Turning now to FIG. 3 with reference to FIG. 2, an embodiment 50 of the multi-bit unit element DAC 32 will be further described. In the DAC 32 used in the feedback path of the embodiment 10, in one embodiment the number of required elements is equal to $2^N*LSB$, where N is the number of bits used by the DAC 32 (e.g., the width of the multi-bit digital output 30) and LSB is the Least Significant Bit of the multi-bit path. In other embodiments, any number of elements can be used, not necessarily constrained to being a multiple of two. For illustration purposes, the width of the example embodiment 50 of FIG. 3 is two bits, thus requiring four unary weighted elements, wherein each element represent one LSB current relative to a full scale current. Other bit widths are envisioned with the scope of this disclosure.

The embodiment 50 includes a bias source 50 and a DAC output 52. A plurality of switches 54a, 54b, 54c and 54d (generally 54), are connected in series with respective unary weighted current sources 56a, 56b, 56c and 56d (generally 56). Each of the current sources 56 is connected to the ground 42. Each switch 54 and a respective current source 56 (e.g. switch 54a and current source 56a) is referred to as an "element." For the embodiment 50, a digital input of "0111" (e.g., three) is represented by connecting the DAC output 52 to three elements by activating three of the four switches 54, having respective current sources 56. If the next digital input is "1111" (e.g., four), then the DAC output 52 will be connected to the remaining element.

Each of the current sources 56, includes a nominal current plus a respective random offset current, where the respective random offset current either adds to or subtracts from the nominal current. Randomizing the order of the unit elements can be accomplished by any of the randomization methods that are well known in the art such as applying a power to the memory, which has been designed to come up in a random state at power up or using a linear feedback shift register. As the digital input to the multi-bit unit element DAC 32 of FIG. 1 changes, one or more elements are connected to the DAC output 14. Each of the unary weighted elements have the same nominal current, hence there are a plurality of combinations of selecting elements to achieve the same value of the DAC output 14 in response to a change in the digital output 30. The embodiment 50 of FIG. 3 is one of many unit element DACs that can be used with the system of FIG. 1. The embodiment 50 is a current output DAC, which is used with an embodiment 10 where the analog input 16 is represented by a current. In another embodiment, the multi-bit unit element DAC 32 supplies a voltage output (e.g., a Kelvin Divider) to the summing circuit 12 and the analog input 16 is represented by a voltage.

Figure 5:
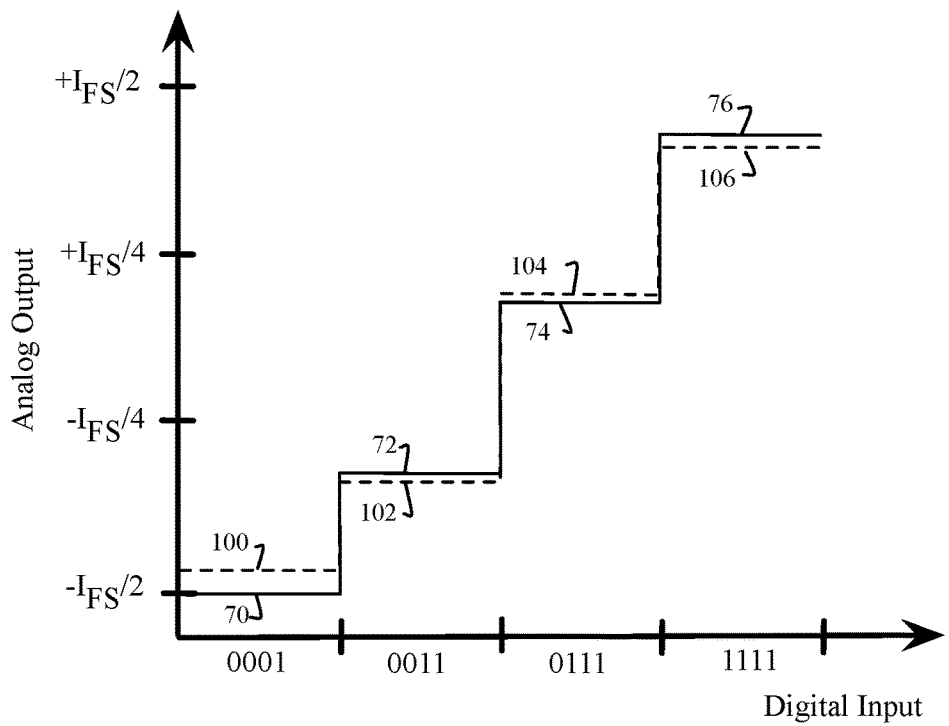
FIG. 5 is a graphical view of the output of the DAC of FIG. 1 with optimal DAC element selection in accordance with an example embodiment of the present disclosure.

FIG. 4 shows the nonlinear characteristics of the DAC output 14 of FIG. 1, before optimizing the ordering of the selectable elements of the multi-bit unit element DAC 32. In contrast, FIG. 5 shows the nonlinear characteristics of the DAC output 14 of FIG. 1, after optimizing the ordering of the selectable elements of the multi-bit unit element DAC 32. Due to the mismatch between each of the current sources 56 of FIG. 3, each element will have an offset, either positive or negative relative to the ideal or average value. For example, if the digital input (e.g., or the digital output 30) to the multi-bit unit element DAC 32 is ramped from zero to full scale, the multi-bit unit element DAC 32 would use the first element, then sequentially add additional elements until all of the elements are used. The analog output of the DAC 32 will ideally represent a staircase with equal steps. However, due to offsets each step will be change based on the cumulative offsets of the respective elements.

If the layout of the elements of the multi-bit unit element DAC 32 follows best practices and no layout skew exists, the mismatch of each element follows a normal Gaussian distribution. Therefore, as the number of elements approaches infinity, the mean of the summation of offsets would yield a zero mean with equal probabilistic weighting of positive and negative offsets. Therefore, in the limit of such a large selection of elements, the relationship the digital input to the analog output shown in FIG. 4 and FIG. 5 approaches a straight line. It is not practical to design an infinite numbers of elements. However, with proper permutation of the existing elements a significant improvement in linearity and thus SNDR is achieved.

Returning to FIG. 4 and with reference to FIG. 3, the output of the multi-bit unit element DAC 32 is shown based on a two-bit binary system with four elements. As the digital input to the DAC 32 (e.g., the digital output 30) progresses from "0000" to "1111" the DAC output 14, (or analog output) would ideally follow the equal current steps 70, 72, 74 and 76. Due to mismatch induced offsets in the current sources 56, step 70 is increased by an offset 80 due to the first current source 56a to yield a step 90. Step 72 is increased by an offset 80 from the first selected current source 56a and an offset 82 from the second selected current source 56b to yield a step 92. The cumulative offset is equal to 80 plus 82. Similarly, step 94 is increased by offsets 80 and 82 and decreased by 84 (the offset from the third current source 56c) to yield a step 94. Lastly, Step 76 is altered by offsets 80, 82, 84 and 86 (from the fourth current source 56d) to yield a step 96. As shown by FIG. 4, the linearity of steps 90, 92, 94 and 96 is poor, thus causing distortion and thereby leading to low SNDR.

In contrast to FIG. 4, FIG. 5 shows an improved linearity of the DAC 32 due to optimized ordering of elements. Rather than progressively combining the first, second, third, and fourth current sources 56a, 56b, 56c and 56d respectively, as was done in FIG. 4, an optimized element order is chosen. Specifically, the first current source 56a is chosen for input "0000" because the offset 80 is the smallest of the four offsets. For input "0011" the fourth current source 56d is chosen so that the cumulative offset 80 and 86 largely cancel each other. Subsequently, for input "0111" the second current source 56b is chosen, so that the cumulative offsets 80, 86 and 82 still remain close to zero. Lastly, for input "1111" the third current source 56c is chosen so that the cumulative offsets 80, 86, 82 and 84 yield a small negative offset. As can be seen from FIG. 5, the DAC output 14 with the optimized ordering shown by 100, 102, 104 and 106 closely approximates the ideal output shown by 70, 72, 74, and 76.

Figure 6:
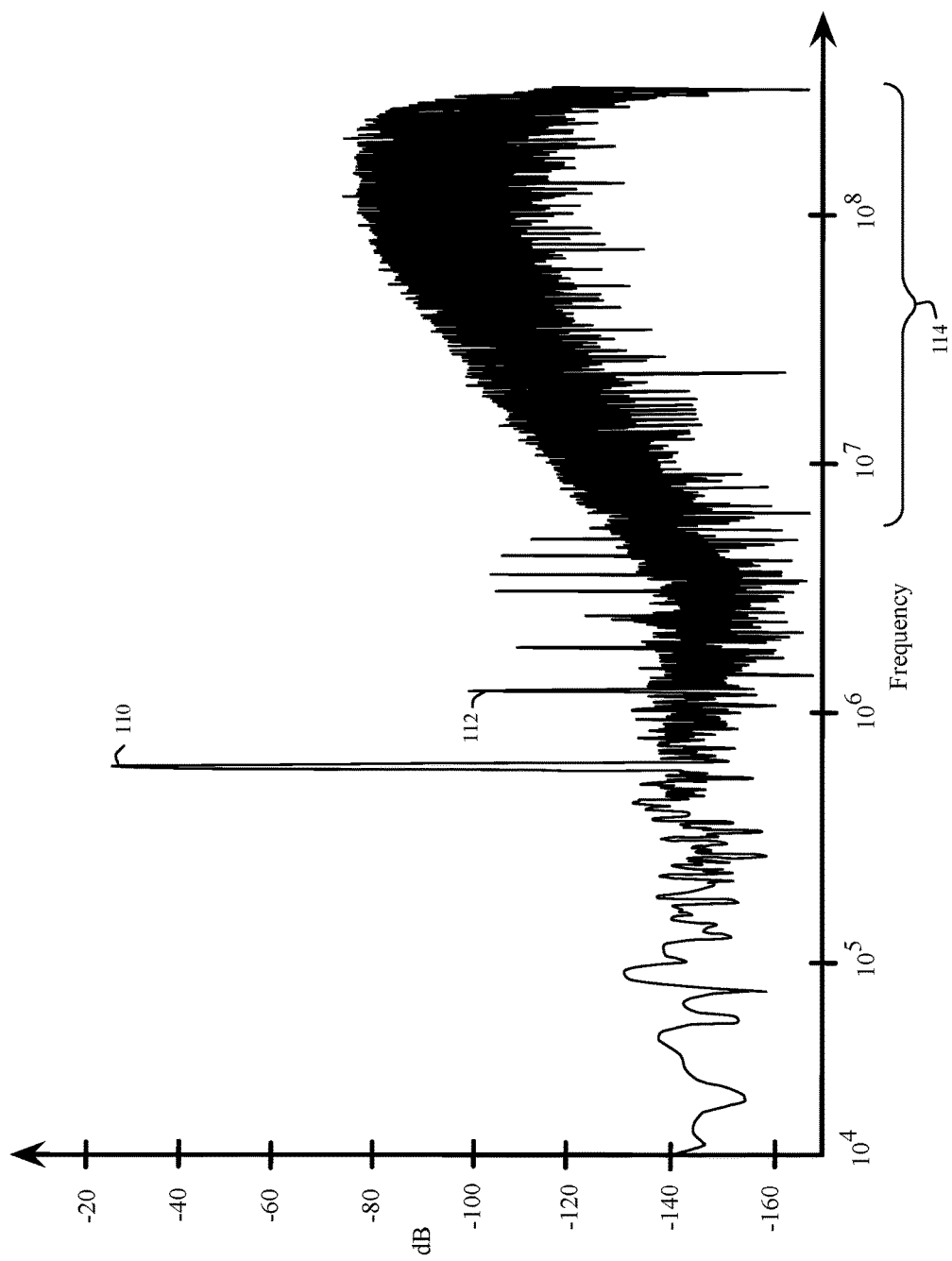
FIG. 6 is a graphical view of a Fast Fourier Transform (FFT) of an output of a Sigma-Delta ADC employing a 4-bit quantizer ADC and a 4-bit feedback DAC

FIG. 6 shows a Fast Fourier Transform of an output of a Sigma-Delta ADC system employing a 4-bit quantizer ADC and a 4-bit feedback DAC showing decibels relative to full scale for a range of frequencies, and using no DAC linearity correction technique such as optimized element ordering or data weighted averaging. In FIG. 6, the fundamental signal peak is 110 is shown in relation to a plurality of significant distortion components 112. Shaped noise 114 is shown to be shifted to a higher frequency band, which can be filtered with a digital low pass filter in a post processing step, however the SNDR is only 67 dB with an SNR of 84 dB.

Figure 7:
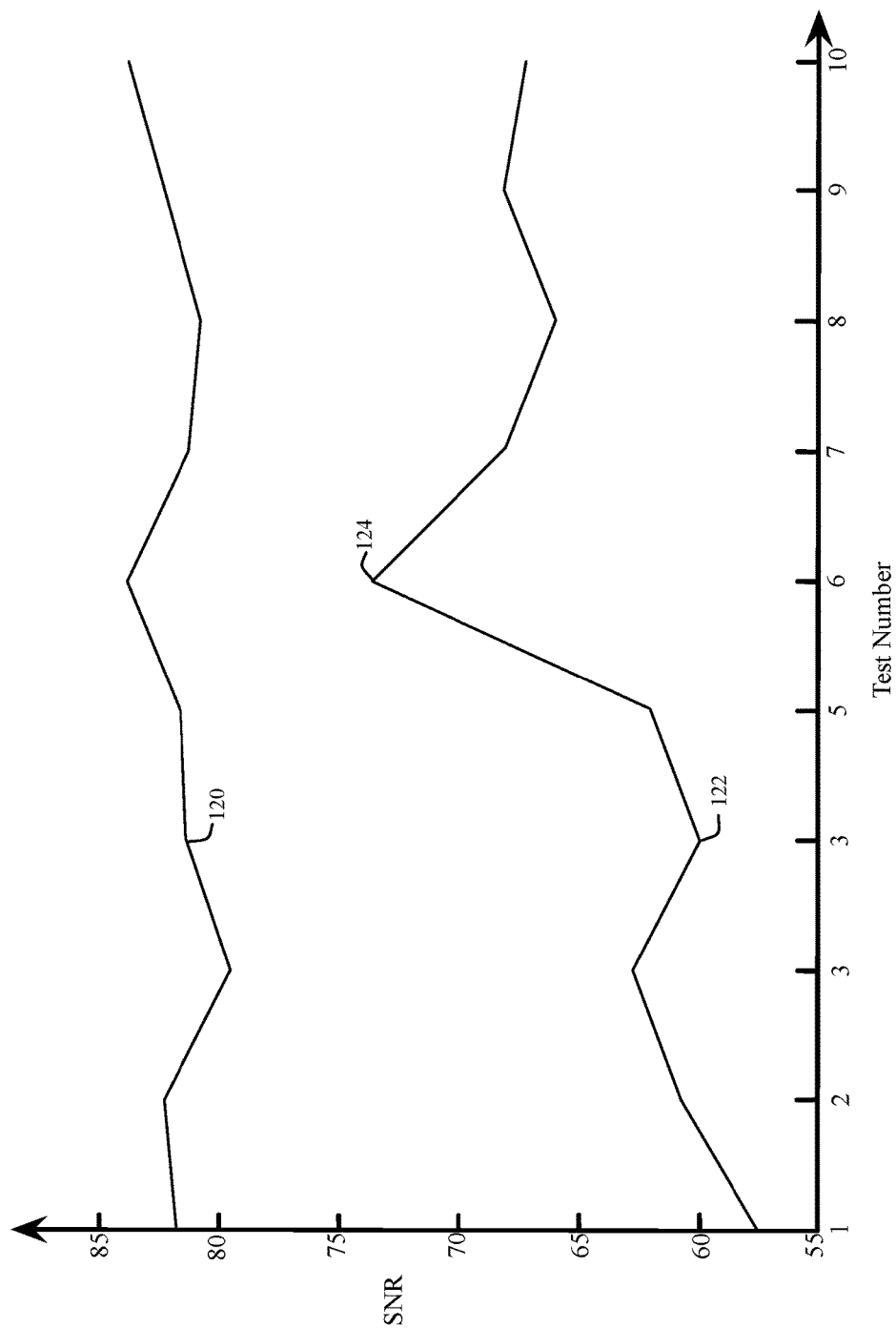
FIG. 7 is a graphical view of SNDR and Signal-to-Noise Ratio (SNR) for a series of test characterization runs of the system of FIG. 1.

FIG. 7 shows measured SNDR and SNR for a series of tests (numbered 1 through 10) of one ADC, where the DAC element ordering is randomly defined for each test of the system of FIG. 1. In one embodiment, the DAC elements are randomly defined upon application of power to the DAC 32. In another embodiment, the randomization of the DAC elements is performed by a random number generator, (e.g., a linear feedback shift register). As shown, the SNR variation is only approximately 3 dB due to quantization and other system noise. FIG. 7 shows a significant improvement in SNDR from 57 dB measured from the first test run to 72 dB measured from the sixth test run for the same ADC with different ordering of the DAC elements, or a 15 dB improvement. In one embodiment, the SNDR is measured with an external tester used for production testing of semiconductor components. In another embodiment, the SNDR is measured with a wafer probe tester.

Extensive measurements have consistently demonstrated that six to eight test runs have yielded significant improvements in SNDR. The term "optimized ordering" as used throughout this disclosure includes an ordering of the DAC unit elements determined from a series of tests that include randomization of the unit elements that comprise the DAC that is used in the Sigma-Delta ADC of FIG. 7. In one embodiment, the tests to determine the optimized element ordering are performed during wafer probe testing. In another embodiment, the tests to determine the optimized ordering of the DAC unit elements are performed during post assembly (packaging) testing. In another embodiment, a full determination of all possible unit element ordering combinations of a subset of the most critical of the unit elements that comprise the DAC is determined by only considering the elements that will be used the most often (e.g. those in the center of the DAC output range) by applying an input to the ADC that only uses a limited range of the quantizer's (e.g., ADC 24) digital output 30. In another embodiment, the optimal element ordering is defined through randomization wherein the digital output 30 is limited to a high slope region, such as zero crossing of a sinusoidal waveform. Accordingly, this limited range exceeds a slope threshold where changes to the DAC output 14 of FIG. 1 are of a greater magnitude than in low slope regions.

Figure 8:
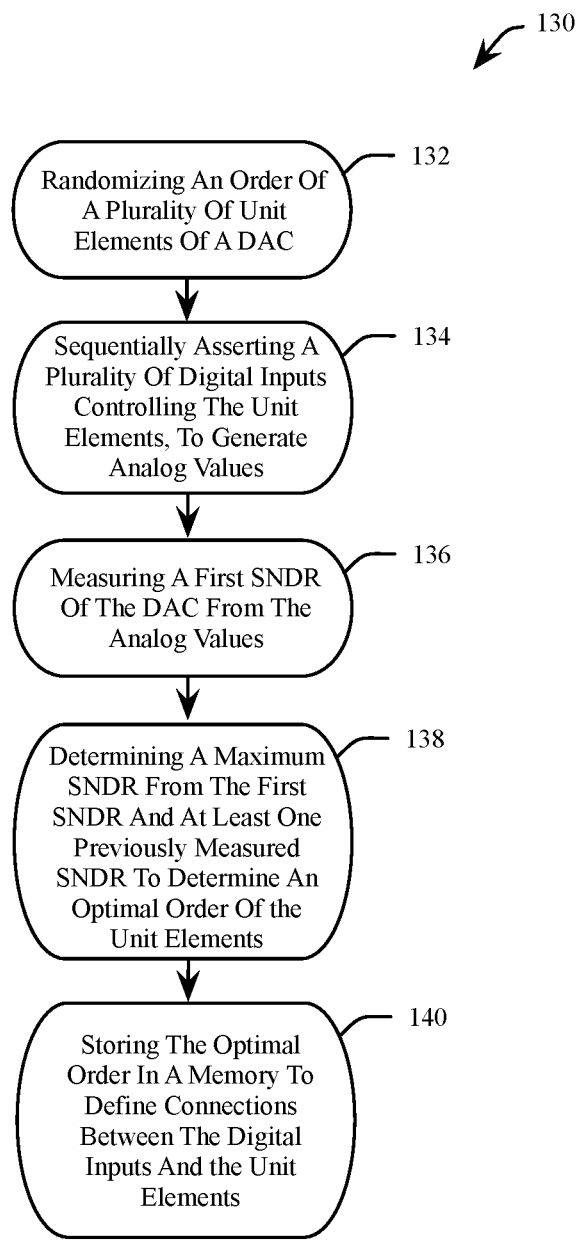
FIG. 8 is a flowchart representation of a method for SNDR improvement through optimal DAC element selection in accordance with an example embodiment of the present disclosure.

FIG. 8 shows a method 130 for SNDR improvement through optimal DAC element selection. At 132, an order of a plurality of unit element of a DAC is randomized. At 134, a plurality of digital inputs, controlling the unit elements, is ramped to generate analog outputs. At 136, a first SNDR of the DAC is measured from the analog outputs. At 138, a maximum SNDR is determined from the first SNDR and at least one previously measured SNDR, using the same method as used to determine the first SNDR, to determine an optimal order of the unit elements. At 140, the optimal order is stored in a memory to define the connections between the digital inputs and the unit elements.

Figure 9:
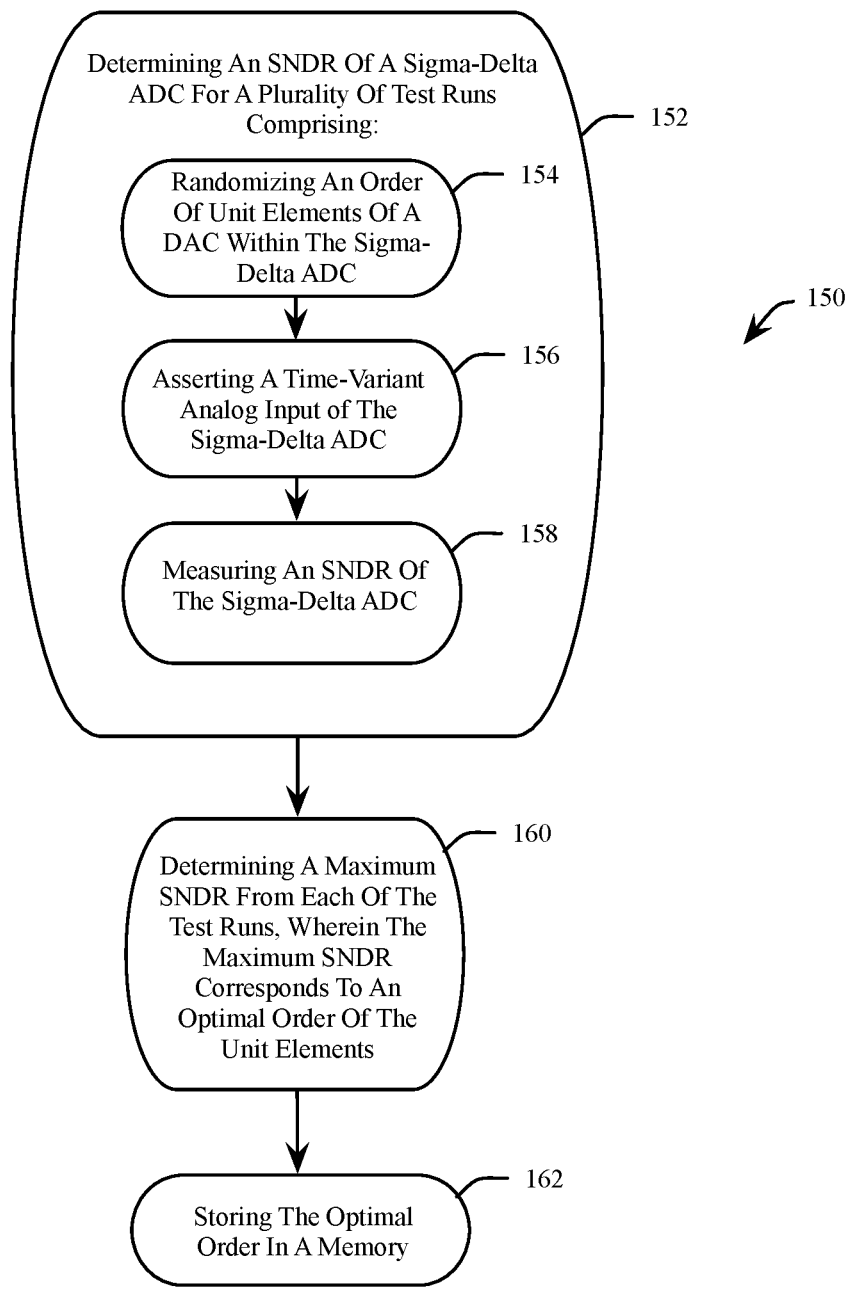
FIG. 9 is a flowchart representation of a method for SNDR improvement through optimal DAC element selection in accordance with an example embodiment of the present disclosure.

FIG. 9 shows another method 150 for SNDR improvement through optimal DAC element selection. At 152, an SNDR of a Sigma-Delta ADC is determined for a plurality of test runs. In one embodiment, the Sigma-Delta ADC comprises the system 10 of FIG. 1 followed by a digital filter. Determining the SNDR at 152 comprises at 154, randomizing an order of the unit elements of a DAC within the Sigma-Delta ADC; at 156, ramping a time-variant analog input of the Sigma-Delta ADC, and at 158, measuring an SNDR of the Sigma-Delta ADC. At 160, a maximum SNDR is determined from each of the test runs, wherein the maximum SNDR corresponds to an optimal order of the unit elements. At 162, the optimal order is stored in a memory.

As will be appreciated, embodiments as disclosed include at least the following. In one embodiment, a method for Signal-to-Noise and Distortion Ratio (SNDR) improvement through optimal Digital-to-Analog-Converter (DAC) element selection comprises randomizing an order of a plurality of unit elements of a DAC, wherein each of the unit elements is controlled by a respective one of a plurality of digital inputs of the DAC. The plurality of digital inputs are sequentially asserted over at least a subset of a full set of the digital inputs to generate a plurality of analog values of an analog output of the DAC. A first SNDR of the DAC is measured from the plurality of analog values. A maximum SNDR is determined from the first SNDR and at least one previously measured SNDR, the maximum SNDR corresponding to an optimal order of the unit elements. The optimal order of the unit elements of the DAC is stored in a memory to define connections between the digital inputs and the respective unit elements based on the optimal order.

Alternative embodiments of the method for Signal-to-Noise and Distortion Ratio (SNDR) improvement through optimal Digital-to-Analog-Converter (DAC) element selection include one of the following features, or any combination thereof. The optimal order of the unit elements is accessed from the memory by the DAC, for subsequently converting the digital inputs to the respective analog values. The subset is centered within the full set. The subset is equal to the full set. The at least one previously measured SNDR comprises at least five measured SNDR. Randomizing the order of the unit elements comprises applying a power to the memory, wherein the memory is designed to comprise random states in response to applying the power. Randomizing the order of the unit elements comprises defining the order with a plurality of outputs of a linear feedback shift register. The full set of the digital inputs is determined by quantizing a sine wave. The full set of the digital inputs is determined by quantizing a periodic signal. Each of the analog values comprises a cumulative offset current formed by a summation of a respective random offset current of each unit element selected by the optimal order.

In another embodiment, a system for Signal-to-Noise and Distortion Ratio (SNDR) improvement through optimal Digital-to-Analog-Converter (DAC) element selection comprises a plurality of unit elements of a DAC, wherein an order of the unit elements is configured to be randomized. Each of a plurality of digital inputs of the DAC is configured to control a respective unit element based on the order of the unit elements. An analog output of the DAC is switchably connected to one or more of the unit elements based on a respective value of each of the respective digital inputs. A memory is configured to store the optimal order of the unit elements of the DAC to define connections between the digital inputs and the respective unit elements, wherein the optimal order is determined from an optimal test run of a plurality of test runs, each of the test runs determine a respective SNDR, and the optimal test run comprises a maximum SNDR.

Alternative embodiments of the system for a system for Signal-to-Noise and Distortion Ratio (SNDR) improvement through optimal Digital-to-Analog-Converter (DAC) element selection include one of the following features, or any combination thereof. A tester is configured to determine the respective SNDR of each of the test runs by sequentially asserting the plurality of digital inputs over at least a subset of a full set of the digital inputs to generate a plurality of analog values of the analog output, and measuring the SNDR of the DAC from the plurality of analog values. Each of the unit elements comprise a switchable current source comprising a nominal current having a respective random offset current. The analog output comprises a cumulative offset current formed by a summation of a respective random offset current of each unit element selected by the optimal order. A Sigma-Delta Analog-to-Digital Converter (ADC) comprises an ADC configured to quantize a filtered sum of the analog output of the DAC subtracted from a time-variant analog input of the Sigma-Delta ADC.

In another embodiment, a method for Signal-to-Noise and Distortion Ratio (SNDR) improvement through optimal Digital-to-Analog-Converter (DAC) element selection comprises determining an SNDR of a Sigma-Delta Analog-to-Digital Converter (ADC) for a plurality of test runs, wherein each test run comprises: randomizing an order of a plurality of unit elements of a DAC, the Sigma-Delta ADC comprising an ADC configured to quantize a filtered sum of an output of the DAC subtracted from a time-variant analog input of the Sigma-Delta ADC, asserting the time-variant analog input over at least a subset of a full range of the analog signal, and measuring an SNDR of the Sigma-Delta ADC. A maximum SNDR is determined from a respective SNDR of each of the test runs, wherein the maximum SNDR corresponds to an optimal order of the unit elements. The optimal order of the unit elements is stored in a memory.

Alternative embodiments of the method for Signal-to-Noise and Distortion Ratio (SNDR) improvement through optimal Digital-to-Analog-Converter (DAC) element selection include one of the following features, or any combination thereof. The optimal order of the unit elements is accessed from the memory by the DAC, for subsequently generating a plurality of analog values of the output of the DAC. Randomizing the order of the unit elements comprises applying a power to the memory, wherein the memory is designed to comprise random states in response to applying the power. Randomizing the order of the unit elements comprises defining the order with a plurality of outputs of a linear feedback shift register. The time-variant analog input is a sine wave.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for Signal-to-Noise and Distortion Ratio (SNDR) improvement through optimal Digital-to-Analog-Converter (DAC) element selection comprising:
    randomizing an order of a plurality of unit elements of a DAC, wherein each of the unit elements is controlled by a respective one of a plurality of digital inputs of the DAC;
    sequentially asserting the plurality of digital inputs over at least a subset of a full set of the digital inputs to generate a plurality of analog values of an analog output of the DAC;
    measuring a first SNDR of the DAC from the plurality of analog values;
    determining a maximum SNDR from the first SNDR and at least one previously measured SNDR, the maximum SNDR corresponding to an optimal order of the unit elements; and
    storing the optimal order of the unit elements of the DAC in a memory to define connections between the digital inputs and the respective unit elements based on the optimal order.

2. The method of claim 1 further comprising accessing the optimal order of the unit elements from the memory by the DAC, for subsequently converting the digital inputs to the respective analog values.

3. The method of claim 1 wherein the subset is centered within the full set.

4. The method of claim 1 wherein the subset is equal to the full set.

5. The method of claim 1 wherein the at least one previously measured SNDR comprises at least five measured SNDR.

6. The method of claim 1 wherein randomizing the order of the unit elements comprises applying a power to the memory, wherein the memory is designed to comprise random states in response to applying the power.

7. The method of claim 1 wherein randomizing the order of the unit elements comprises defining the order with a plurality of outputs of a linear feedback shift register.

8. The method of claim 1 wherein the full set of the digital inputs is determined by quantizing a sine wave.

9. The method of claim 1 wherein the full set of the digital inputs is determined by quantizing a periodic signal.

10. The method of claim 1 wherein each of the analog values comprises a cumulative offset current formed by a summation of a respective random offset current of each unit element selected by the optimal order.

11. A system for Signal-to-Noise and Distortion Ratio (SNDR) improvement through optimal Digital-to-Analog-Converter (DAC) element selection comprising:
a plurality of unit elements of a DAC, wherein an order of the unit elements is configured to be randomized;
a plurality of digital inputs of the DAC, each of the digital inputs configured to control a respective unit element based on the order of the unit elements;
an analog output of the DAC switchably connected to one or more of the unit elements based on a respective value of each of the respective digital inputs; and
a memory configured to store the optimal order of the unit elements of the DAC to define connections between the digital inputs and the respective unit elements, wherein the optimal order is determined from an optimal test run of a plurality of test runs, each of the test runs determine a respective SNDR, and the optimal test run comprises a maximum SNDR.

12. The system of claim 11 comprising a tester configured to determine the respective SNDR of each of the test runs by sequentially asserting the plurality of digital inputs over at least a subset of a full set of the digital inputs to generate a plurality of analog values of the analog output, and measuring the SNDR of the DAC from the plurality of analog values.

13. The system of claim 11 wherein each of the unit elements comprise a switchable current source comprising a nominal current having a respective random offset current.

14. The system of claim 11 wherein the analog output comprises a cumulative offset current formed by a summation of a respective random offset current of each unit element selected by the optimal order.

15. The system of claim 11 further comprising a Sigma-Delta Analog-to-Digital Converter (ADC) comprising an ADC configured to quantize a filtered sum of the analog output of the DAC subtracted from a time-variant analog input of the Sigma-Delta ADC.

16. A method for Signal-to-Noise and Distortion Ratio (SNDR) improvement through optimal Digital-to-Analog-Converter (DAC) element selection comprising:
determining an SNDR of a Sigma-Delta Analog-to-Digital Converter (ADC) for a plurality of test runs, wherein each test run comprises:
randomizing an order of a plurality of unit elements of a DAC, the Sigma-Delta ADC comprising an ADC configured to quantize a filtered sum of an output of the DAC subtracted from a time-variant analog input of the Sigma-Delta ADC,
asserting the time-variant analog input over at least a subset of a full range of the analog signal, and
measuring an SNDR of the Sigma-Delta ADC;
determining a maximum SNDR from a respective SNDR of each of the test runs, wherein the maximum SNDR corresponds to an optimal order of the unit elements; and
storing the optimal order of the unit elements in a memory.

17. The method of claim 16 further comprising accessing the optimal order of the unit elements from the memory by the DAC, for subsequently generating a plurality of analog values of the output of the DAC.

18. The method of claim 16 wherein randomizing the order of the unit elements comprises applying a power to the memory, wherein the memory is designed to comprise random states in response to applying the power.

19. The method of claim 16 wherein randomizing the order of the unit elements comprises defining the order with a plurality of outputs of a linear feedback shift register.

20. The method of claim 16 wherein the time-variant analog input is a sine wave.

* * * * *